United States Patent [19]

Sekiya

[11] Patent Number: 4,521,995
[45] Date of Patent: Jun. 11, 1985

[54] WAFER ATTRACTING AND FIXING DEVICE

[75] Inventor: Shinji Sekiya, Tokyo, Japan

[73] Assignee: Disco Co., Ltd., Tokyo, Japan

[21] Appl. No.: 265,318

[22] Filed: May 20, 1981

[30] Foreign Application Priority Data

May 23, 1980 [JP] Japan .................................. 55-068471
May 23, 1980 [JP] Japan .................................. 55-071025

[51] Int. Cl.$^3$ ............................................... B24B 41/06
[52] U.S. Cl. .................................... 51/235; 51/216 R;
51/216 LP; 125/35; 269/21
[58] Field of Search ............ 51/131.1, 131.5, 215 UE,
51/216 R, 235, 283, 216 LP; 269/21; 198/484;
294/64 R; 125/35; 406/84

[56] References Cited

U.S. PATENT DOCUMENTS

| | | | |
|---|---|---|---|
| 1,607,292 | 11/1926 | Miller | 51/215 UE |
| 2,521,030 | 9/1950 | Wilson | 51/216 R |
| 3,233,887 | 2/1966 | Dunham | 269/21 |
| 3,294,392 | 12/1966 | Dunham | 51/235 X |
| 3,449,870 | 6/1969 | Jensen | 51/283 X |
| 3,953,013 | 4/1976 | Griffith et al. | 51/235 |
| 4,049,484 | 9/1977 | Priest et al. | 294/64 R |

Primary Examiner—Douglas D. Watts
Attorney, Agent, or Firm—Flynn, Thiel, Boutell & Tanis

[57] ABSTRACT

A work head for attracting and fixing an IC silicon wafer is comprised of an attracting disc and a base seat surrounding the periphery of the attracting disk. The attracting disc is of an inorganic substance shaped and sintered so that the upper layer of the attracting disc is composed of a porous body of porous grain and the lower layer the attracting body is formed with a slightly coarse body of porous grain.

The base seat is made airtight, being formed and sintered with the same substance as the attracting disc. The attracting disc and the base seat are coupled with glass having a low melting point. The attracting disc is connected to a connecting hole drilled through the base seat and further to a water injecting hole and air sucking hole of a lower base. Before the wafer is attracted, water is injected from the injection hole for soaking the attracting surface. The surface tension of water transfers the wafer to the center of the attracting surface. Hereafter, the wafer is attracted onto the attracting surface by sucking air out. After the working, water is injected again for floating the wafer.

4 Claims, 11 Drawing Figures

WAFER ATTRACTING AND FIXING DEVICE

BACKGROUND OF INVENTION

The present invention relates to an attracting and fixing device for attracting and fixing a silicon wafer to a work head by air sucking in.

Figure 1:
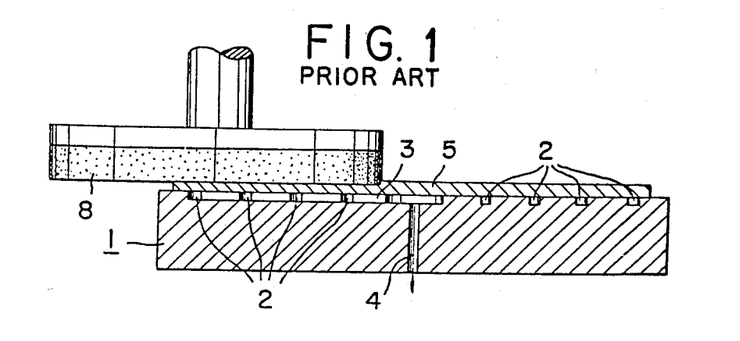
FIG. 1 is a sectional view showing a conventional attracting disc with ring like slots.

The surface of the silicon wafer on which an IC circuit is made is precisely ground, cut or measured with accuracy in the unit of $\mu m$. In this case the silicon wafer is attracted and fixed on the work head by air sucking action. As the fixing method, methods shown in FIGS. 1 and 2 have been conventionally employed, wherein many circular slots in concentric circles are formed on the upper surface of the working base (1). The circular slots are connected with radial connecting slots. The silicon wafer (5) is sucked from an air conducting hole (4) at the center for fixing it as shown in FIG. 1, or as the work head, an attracting disc of porous substance (6) is utilized. The periphery of it is surrounded with a base seat (7) of metal or synthetic resin with no permeability. Air sucking is performed through the air conducting hole (4) at the center for fixing the wafer as shown in FIG. 2.

According to the method shown in FIG. 1, an air gap is caused between the silicon wafer (5) and the attracting surface due to slots (2), (3).

If sucked heavily or pressed from the above when the wafer is ground and worked, the wafer is distorted locally causing error in cut size, or it becomes uneven when air is sucked out after working. For example, when grinding a thin wafer of 0.1~0.5 mm (0.1 to 0.5 mm) thick the wafer is sucked heavily and pressed down by a rotary grindstone (8) from above. Therefore, it is curved downward at portions of slots (2), (3). If the wafer is so pressed down during grinding, when the pressure is released, only the portions facing to the slots expand. This cannot be neglected in the wafer grinding in which an accuracy within $\pm 5$ $\mu m$ is required.

Figure 2:
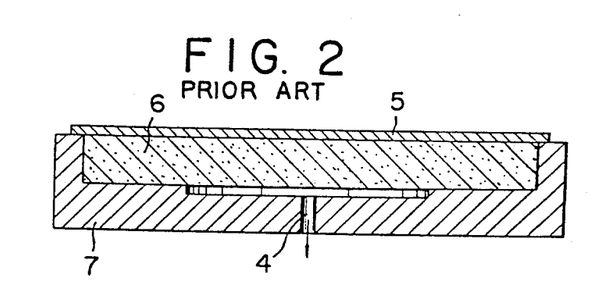
FIG. 2 is a sectional view showing a conventional attracting disc of a porous inorganic substance.
Figure 3:
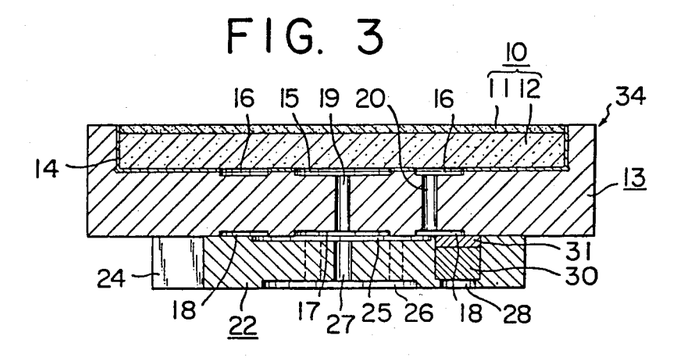
FIG. 3 is a sectional view of the work head according to the present invention.

In a method shown in FIG. 2, the porous attracting disc (6) is composed of a substance having large pores for passing air and cleaning water. Therefore it has defects that it is clogged by dust of the grindstone, causing insufficient sucking and cleaning.

Further, in FIG. 2 the porous attracting disc (6) is necessarily surrounded by the base seat (7) made of material with no porosity.

If the base seat (7) is of metal, as the substance composing the attracting disc (6) and that composing the base seat are different from each other, the attracting disc (6) is probably distorted or peeled off from the base seat (7). Furthermore the method shown in FIG. 2 is defective in that, when the attracting disc (6) is ground, the upper layer of the base seat (7) is also ground, therefore the grindstone and the edged tool are damaged.

In the case that the base seat is made of synthetic resin, the grindstone and the edged tool are not damaged at the time of grinding, however, when the attracting disc (6) is joined with the base seat (7), it is likely that the adhesive resin comes up to the attracting surface through the interior of the porous attracting disc (6), or the attracting surface becomes uneven or distorted due to the difference of the expansion coefficient between the attracting disc and the base seat.

BRIEF SUMMARY OF INVENTION

An object of the present invention is to provide a wafer attracting and fixing device which can be used for a long time without clogging in case of attracting and fixing a silicon wafer to the attracting disc. According to the present invention, to achieve this object, the upper layer of the attracting disc is made of a substance having fine pores, the lower one being made of a substance of coarse pores. Consequently, the disc tesists being clogged with cutting chips, dust, and so forth. Further it is scarcely affected by the sucking action.

Another object of the present invention is to provide the wafer attracting and fixing device in which the combination of the attracting disc and a base seat is made more reliable than the conventional one. For achieving this object, in the present invention, the attracting disc and the base seat are formed with the same inorganic substance. These are adhered to each other with glass with a low melting point. As the result, the attracting disc and the base seat have the same thermal expansion coefficient preventing deformation and peeling.

Another object of the present invention is to provide a device in which the silicon wafer can be easily located by the surface tension of water. According to the present invention water is sent pressurized from the base seat side, being spouted out slowly onto the surface of the attracting disc for making a water film. The wafer put on the water film is transferred to the center of the attracting disc by the surface tension of water. It is necessary that the attracting disc is a disc like body having nearly the same diameter as that of the wafer.

The other object is to provide a device in which the work head composed of the attracting disc and the base seat can be fixed to a lower base simply and interchangeably. The silicon wafer as a work piece can have any diameter which is one of various diameters normally ranging from 2 inch to 6 inch in every half inch. Therefore, work heads having different diameters of attracting disc must be simply interchanged on the lower base. In the present invention, the work head is fixed by magnets in the vertical direction and the movement of it in the horizontal direction is regulated by coupling the notch and a projection.

Other objects and features of the present invention will be obvious from the description given hereafter.

Hereinafter, an embodiment of the present invention will be described based on the drawings shown in FIGS. 3, 4, 5, 6, 7, 8, and 9.

Figure 4A:
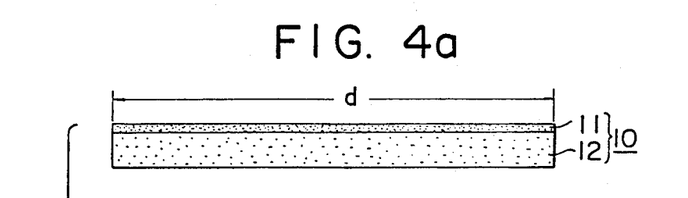
FIGS. 4a, 4b and 4c are sectional views of the respective composing portions of the work head shown in FIG. 3.

In FIG. 4a the numeral (10) shows an attracting disc in which a porous upper layer with fine pores (11) and a porous lower layer with pores that are a little coarse are joined together and sintered. The attracting disc (10) is one of these which are prepared to have a little smaller diameter than that of the silicon wafer (5) (9 kinds ranging from 2" to 6" in every half inch) as the work piece. The upper layer (11) of fine alundum grindstone powder, for example, of #40 and/or #60 grades for making the porosity small and the lower layer (12) of coarse grindstone powder such as of #20 grade for making the porosity large are joined together and sintered. Then, the attracting disc (10) is now formed as a unit which has the upper layer (11) of nearly 2 mm thick and the lower layer (12) of nearly 8 mm joined together.

Figure 4B:
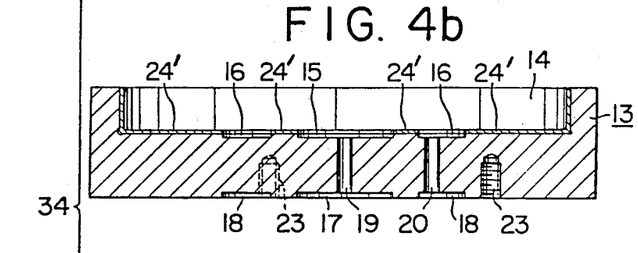
Figure 5:
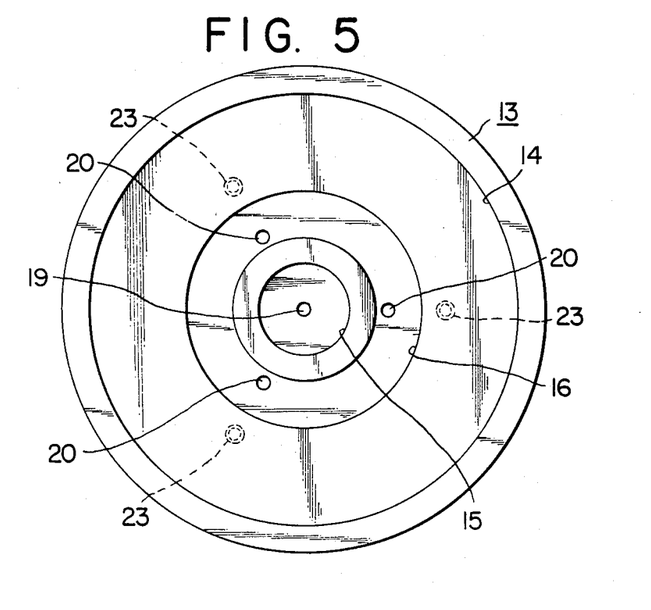
FIG. 5 shows the plan view of the base seat shown in FIG. 4b.

In FIGS. 4b and 5, the numeral (13) shows a base seat into which said attracting disc (10) is fitted. A hollow portion (14) in the base seat (13) is formed with one inside diameter of various ones corresponding to the outer diameters for said attracting disc (10) for fitting. Also, the base seat (13) is made of the same substance as that of the attracting disc (10), for example, alundum grindstone powder of extremely fine grade such as of (#600) sintered for making the base seat non porous.

On the inner and outer surfaces of the hollow (14) of the base seat (13), shallow slots (15), (16), (17) and (18) are respectively formed at the central portion and on its periphery. The shallow slots (15) and (17), and (16) and (18) are respectively in communication up and down through the connecting holes (19) and (20).

On the lower surface of the base seat (13), holes for set screws are provided for fitting disc (22) to the lower base (21) described later. For fixing the attracting disc (10) to the base seat (13), glass powder (24') with a low melting point is put on the inner wall of the hollow (14) except the shallow slots (15), (16). Onto the glass powder coated base seat, the attracting disc (10) is fitted pressurized, and then these are heated at the predetermined temperature for the glass powder to be melted. Thus, these are joined by so called hermetic seal method.

Figure 4C:
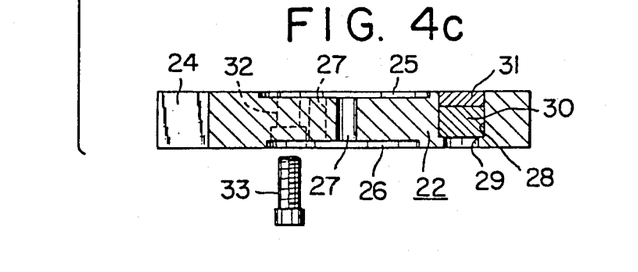
Figure 6:
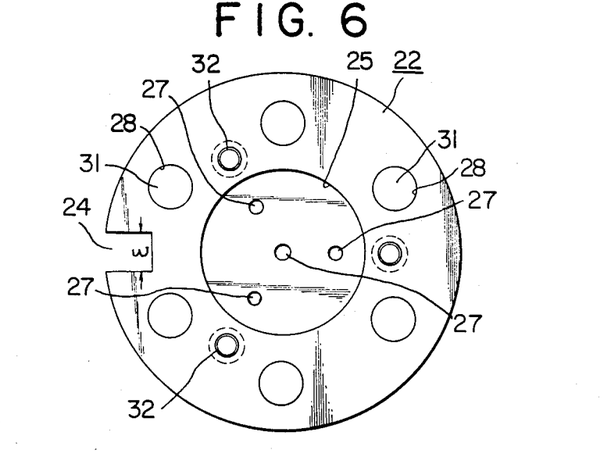
FIG. 6 is the plan view of a coupling disc.

Said fitting disc (22) has its thickness and diameter regulated accurately as shown in FIGS. 4c and 6. At a point of the outer periphery of the disc a notch (24) is formed with an accurate width (w). Shallow slots (25), and (26) are formed on the upper and lower surface respectively. Connecting holes (27) are provided by drilling at the central portion and three places surrounding it for connecting the upper surface to the lower one. Magnet accommodating holes (28) are formed along the periphery of shallow slots (25) and (26) at the angular interval of 60° with a magnet holding step (29) at a portion. Within the magnet accommodating hole (28), a magnet (30) is accommodated and fixed with a spacer (31). The numeral (32) shows holes for screws (33) by which the fitting disc (22) and said base seat (13) are fixed as a single body. Thus, the work head (34) is formed with the attracting disc (10), the base seat (13) and the fitting disc (22). The attracting surface the work head is coated with is a comparatively soft and thin plastic film (for example, of a few $\mu$m~some hundred $\mu$m) adhered or sprayed, as required. In this case, many small pores are formed through the film or the coat for the attracting action not to be interferred with.

Figure 7:
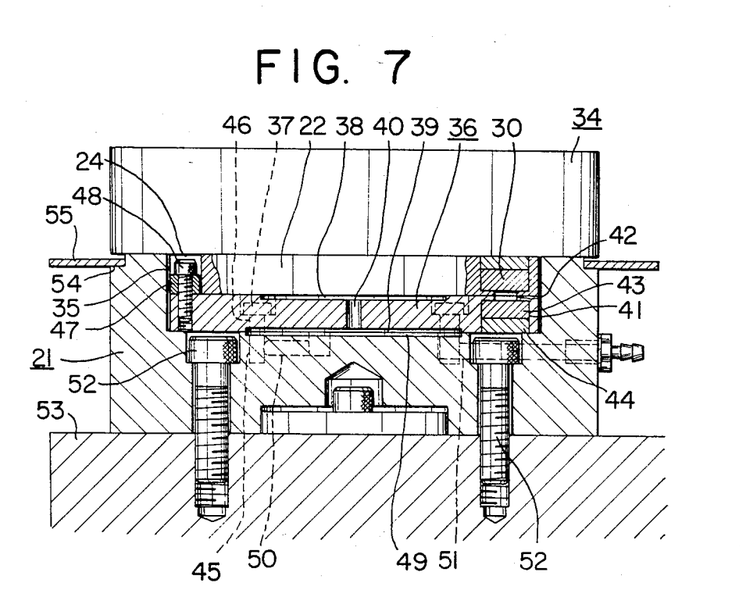
FIG. 7 is a central sectional view of the lower base.
Figure 8:
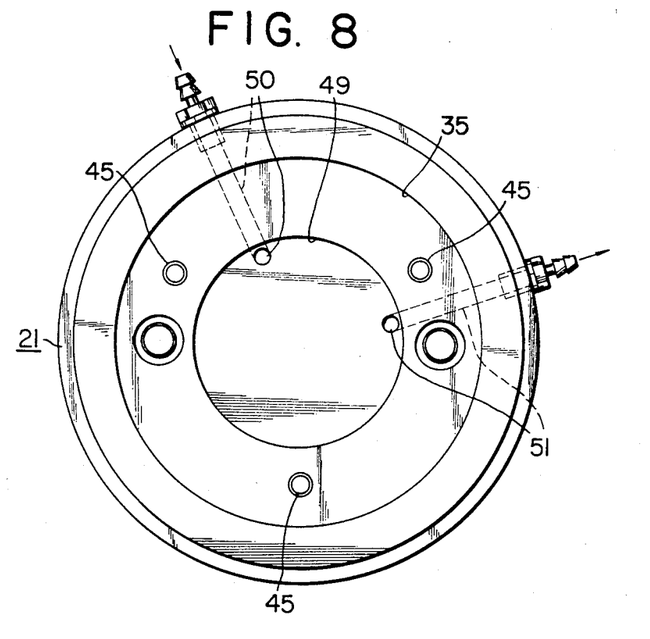
FIG. 8 is the plan view of the lower base shown in FIG. 7.

In FIGS. 7 and 8, the lower base (21) has nearly the same diameter as that of said work head (34). A hollow portion (35) having such a diameter that said fitting disc (22) can be fitted is formed on the upper surface. A disc (36) formed nearly the same as the fitting disc (22) is fixed to the hollow portion (35) by a screw (37). The disc (36) has shallow slots (38) and (39) formed on the central upper and lower surfaces and a connecting hole (40) drilled at the center. Around the shallow slots (38), (39) magnet accommodating holes (41) are drilled at the angular interval of 60° with a magnet holding step (42). A magnet (43) is accommodated in the magnet accommodating hole (40) with a spacer (44). A hole for the screw (46) is drilled in accord with the hole for screw (45) of the lower base (21) for fixing the disc with a screw (37). The disc (36) is different from said fitting disc (22) in that a collar (47) having the same diameter as said width (w) acts as a coupling projection coupling to the notch (24), is fixed with a screw (48) to the disc (36). A cleaning water injecting hole (50) and an air sucking hole (51) are drilled from a shallow slot (49) on the contact surface with the shallow slot (39) of the disc (36) to the side surface on the lower base (21). The lower base (21) is fixed to a driving base (53) with screws (52). On a notch portion (54) along the periphery on the upper and of the lower base (21) an upward forcing plate (55) is fitted for forcing up the work head (34) to remove it.

In such a composition shown above, after selecting a work head (34) having an attracting disc (10) with a suitable diameter for the purpose, the fitting disc (22) on the lower surface of the work head (34) is fitted into the hollow portion (35) of the lower base (21) and rotated right and left, when the notch (24) and the coupling projection (47) coincide, the fitting disc (22) sinks further, and the upper and lower discs (22) and (36) are fixed in close contact by the attraction of the upper and lower magnets (30) and (43).

Figure 9:
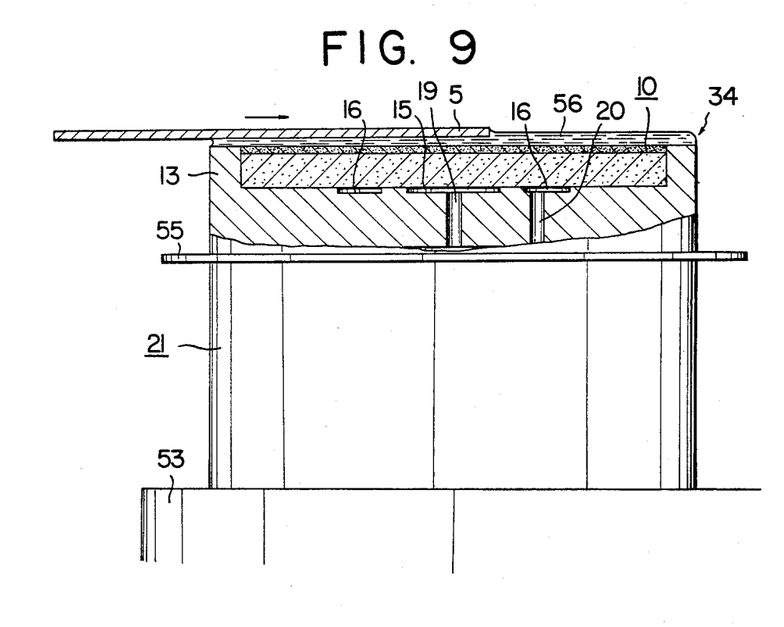
FIG. 9 is the sectional view showing a state in which a piece to be worked is being translated by the surface tension of water.

In this state, as shown in FIG. 9 water sent pressurized from the cleaning water injecting hole (50) is spouted out slowly onto the surface of the attracting disc (10) through the shallow slots (39), (49), the connecting hole (40), the shallow slots (26), (38), the connecting hole (27), the shallow slots (17), (18), (25), the connecting holes (19), (20), and the shallow slots (15), (16) for forming a water layer (56) by the surface tension of water. At this time, if a silicon wafer (5) is put on the water layer, it is transferred to a nearly central position of the attracting disc as shown by an arrow, being stopped and set in position. If sucked from an air sucking hole (51), water and air are sucked out, and the wafer (5) is attracted and fixed to the attracting disc (10). Then the treatments such as grinding by a rotary grindstone (8), cutting for making slots and so forth is perfomed.

After the treatment, if the sucking is stopped, and water is sent again from the cleaning water injecting hole (50), then the wafer (5) floats up from the attracting disc (10), being sent to the next cleaning process.

The attracting force between magnets (30) and (43) should be set so that when water is sent pressurized from below for floating up the wafer (5) after the treatment is complete, the working base may not float up and still the magnets may separate comparatively easily from each other when the work head is interchanged with another.

In the embodiment described above, to each of the fitting disc (2) and the disc (33), the magnets (30) and (43) are fixed, however, one of these magnets may be replaced with a magnetic body.

What is claimed is:

1. A wafer attracting and fixing device, comprising: a work head including a base seat having air sucking holes and on which is provided an attracting disc which receives a wafer and fixes the wafer to the attracting disc by sucking of air from the attracting disc through said air sucking holes, wherein said attracting disc comprises at least two layers, including an upper layer and a lower layer, of porous inorganic substance, the upper layer carrying the attracting surface and having fine pores, the lower layer being adjacent the base seat and having coarse pores, the upper and lower layers of the attracting disc being comprised of alundum grindstone grains sintered under pressure and having different grain size for respective said layers.

2. A wafer attracting and fixing device, comprising: a work head including a base seat having air sucking holes and on which is provided an attracting disc which receives a wafer and fixes the wafer to the attracting disc by sucking of air from the attracting disc through said air sucking holes, wherein said attracting disc comprises at least two layers, including an upper layer and a lower layer, of porous inorganic substance, the upper layer carrying the attracting surface and having fine pores, the lower layer being adjacent the base seat and having coarse pores, the base seat and the attracting disc being composed of the same inorganic material but with that of the base seat being nonporous, said base seat being provided with a hollow portion receiving the attracting disc and making the surface of the base seat and the attracting surface the same level, the base seat and attracting disc being coupled together with glass of low melting point.

3. A wafer attracting and fixing device, comprising a work head carried on a lower base, said work head including a base seat on which is provided a nearly circular attracting disc with an attracting surface for receiving thereon a nearly circular wafer, said lower base having air sucking holes, said base seat having a connecting hole communicating between said attracting disc and air sucking holes for fixing the wafer to the attracting disc by sucking air through air sucking holes of said lower base via said connecting hole of the base seat, said attracting disc being composed of at least two layers, namely an upper layer and a lower layer, of porous inorganic substance, the upper layer carrying the attracting surface and having fine pores, the lower layer being adjacent the side of the base seat and having coarse pores, means defining a water injection hole connected with said connecting hole for making water slowly spout out onto said attracting surface, to transfer a wafer to a stable center position on the attracting disc due to the surface tension of said spouted water.

4. A wafer attracting and fixing device, comprising a work head including a base seat having air sucking holes and on which is provided an attracting disc which receives a wafer, air sucking means connected through said air sucking holes in said base seat for fixing the wafer to the attracting disc by sucking of air, said attracting disc comprising at least two layers, including an upper said layer having an attracting surface, said upper layer being formed by adhesion of granular inorganic material of fine particle size and thereby having fine pores, said layers further including a lower said layer adjacent said base seat, said lower layer being formed by adhesion of granular inorganic material of coarse grain size and thereby having coarse pores, said base seat being composed of the same inorganic material as used for the attracting disc but in airtight form, said base seat being provided with a hollow portion receiving said attracting disc for making the surface of the base seat and the attracting surface on the attracting disc the same level, said base seat and said attracting disc being coupled together with an adherent.

* * * * *

UNITED STATES PATENT AND TRADEMARK OFFICE
CERTIFICATE OF CORRECTION

PATENT NO. : 4 521 995
DATED : June 11, 1985
INVENTOR(S) : Shinji Sekiya

It is certified that error appears in the above-identified patent and that said Letters Patent is hereby corrected as shown below:

Column 4, line 68; after "provided" insert ---a member formed as---.

Column 5, line 5; after "of" insert ---cohesive---.
line 10; delete "sintered under pressure".
line 11; after "layers" insert ---and being attached together under pressure by sintering---.
line 31; delete "carried on a lower base".
line 32; after "provided" insert ---a member formed as---.
line 34; delete "said lower".
line 35; delete "base having air sucking holes,".
change "a" to ---at least one---.

Column 6, line 1; delete "air sucking holes" and insert ---the bottom of said base seat; air supply means---.
line 2; after "air"(first occurrence) insert ---down---.
delete "air sucking holes".
line 3; delete "of said lower base via".
before "said" insert ---a---.
line 6; before "porous" insert ---cohesive---.
line 9; before "means" insert ---water injection---.
after "means" insert ---operatively associated---;
delete "defining a water injection hole".

UNITED STATES PATENT AND TRADEMARK OFFICE
CERTIFICATE OF CORRECTION

PATENT NO. : 4 521 995
DATED : June 11, 1985
INVENTOR(S) : Shinji Sekiya

It is certified that error appears in the above-identified patent and that said Letters Patent is hereby corrected as shown below:

Column 6, line 10; delete "connected".
　　　　　　　　　after "with" insert ---a---.
　　　　　　　　　after "water" insert ---pass upward through the latter and said coarse pore layer and---.
　　　line 11; after "out" insert ---of said fine pore layer---
　　　line 16; after "provided" insert ---a member formed as---.
　　　line 23; change "adhesion" to ---fixed joining---.
　　　line 27; change "adhesion" to ---fixed joining---.

Signed and Sealed this

Twenty-fifth Day of March 1986

[SEAL]

Attest:

DONALD J. QUIGG

Attesting Officer

Commissioner of Patents and Trademarks